United States Patent [19]
Nakanishi

[11] Patent Number: 6,143,819
[45] Date of Patent: Nov. 7, 2000

[54] COMPOSITE SHEET AND METHOD OF MANUFACTURING THE SAME

[75] Inventor: Akio Nakanishi, Tokyo, Japan

[73] Assignee: DuPont Teijin Advanced Papers, Ltd., Tokyo, Japan

[21] Appl. No.: 09/091,901

[22] PCT Filed: Dec. 27, 1996

[86] PCT No.: PCT/JP96/03847

§ 371 Date: Jun. 26, 1998

§ 102(e) Date: Jun. 26, 1998

[87] PCT Pub. No.: WO97/24231

PCT Pub. Date: Jul. 10, 1997

[30] Foreign Application Priority Data

Dec. 28, 1995 [JP] Japan ..................................... 7-343961

[51] Int. Cl.$^7$ ............................... C08J 5/10; C08K 5/20; C08L 51/00; C08L 77/00

[52] U.S. Cl. ......................... 524/538; 524/430; 524/437; 524/492

[58] Field of Search ..................................... 524/430, 437, 524/404, 492, 493, 433, 191, 538

[56] References Cited

U.S. PATENT DOCUMENTS 5,681,612  10/1997  Benedict et al. ........................ 427/240
5,705,258  1/1998  Okami et al. .......................... 428/202

FOREIGN PATENT DOCUMENTS

| | | |
|---|---|---|
| 53-90000 | 8/1978 | Japan . |
| 55-053802 | 4/1980 | Japan . |
| 58-218711 | 12/1983 | Japan . |
| 62-44914 | 2/1987 | Japan . |
| 04012415 | 1/1992 | Japan . |
| 2043446 | 8/1993 | Russian Federation . |
| 9324314 | 12/1993 | WIPO . |

Primary Examiner—James J. Seidleck
Assistant Examiner—U. K. Rajguru
Attorney, Agent, or Firm—Alston & Bird LLP

[57] ABSTRACT

A molded material including a fibrous organic compound and a matrix including a resin having rubber elasticity reinforced with the inorganic filler are composited to form a composite sheet with an internal porosity is 10% or less, a specific gravity of 1 to 2, and a thermal conductivity in a thickness direction of 0.4 W/mK or more. The composite sheet has both electrical insulation property and thermal conductivity, is superior in heat resistance and flexibility, and can be used in electrical apparatus with improved heat dissipation characteristic.

20 Claims, No Drawings

COMPOSITE SHEET AND METHOD OF MANUFACTURING THE SAME

TECHNICAL FILED

The present invention relates to a composite sheet which is excellent in thermal conductivity, heat resistance, electrical characteristics, chemical resistance, mechanical characteristics and the like, and to a production method therefor. More specifically, the present invention relates to a composite sheet which is useful as an electrical insulation material in areas of rotary machines and transformers. The present invention further relates to an electrical apparatus provided with such a composite sheet.

BACKGROUND ART

Heretofore, a molded material based on a heat-resistant polymer has been used in electrical applications requiring heat resistance. In particular, molded materials based on an aromatic polyamide (hereinafter referred to as "aramide") are advantageous industrial materials with heat resistance, chemical resistance, and flame retarding properties which are attributed to the structure of aramide molecules. Above all, tissue paper (registered trademark: NOMEX) comprising fibrid and fiber of poly(m-phenylene isophthalamide) is widely used as electrical insulating paper with excellent heat resistance.

Recently, in areas of rotary machines and transformers, there has been an increasing demand for compact machines for the purpose of reduction in the number of parts and of space-saving. As means for meeting the demand, electrical insulation materials with high thermal conductivity have been needed which can rapidly dissipate heat generated from rotary parts and coils. Conventional aramide tissue paper, which includes air in the inside, is low in thermal conductivity, and thus does not sufficiently meet the above demand.

Heretofore, as for heat dissipation sheets for heat generating electronic parts such as power transistors, thyristors, and the like, there have been proposed organo-polysiloxane (silicone resin) compositions and molded materials therefrom, based on a silicone resin with superior heat resistance mixed with a filler with good thermal conductivity. Their improvement in thermal conductivity, that could not be achieved by silicone resin alone, has been realized by way of adding a filler.

(1) Japanese Patent Application Laying-open No. 14654/1977 describes an organo-polysiloxane composition comprising organo-polysiloxane, organo-hydrogen-polysiloxane, a silica based filler, a zinc carbonate powder, and a platinum catalyst.

(2) Japanese Patent Application Laying-open No. 155506/1978 describes a heat conductive silicone rubber composition comprising organo-polysiloxane, to which are added boron nitride, a low-molecular weight organo-polysiloxane and a hardener.

(3) Japanese Patent Application Laying-open No. 2349/1981 describes a heat dissipating rubber-like molded material with improved thermal conductivity which comprises poly(di-organosiloxane) which is blended with a filler, an organic peroxide catalyst, and silicone oil, vulcanized, and molded.

As described above, silicone resin compositions and molded materials with electrical insulation properties and thermal conductivity are known in the art. However, silicone resin compositions and molded materials of (1) to (3) have been defective in that low tear strength inherent to silicone resins is not overcome and that large amounts of fillers contained therein rather deteriorate their mechanical strength.

With the aim of solving such problems, a method has been proposed in which silicone resin is reinforced with another material as follows.

(4) Japanese Patent Application Laying-open No. 21446/1983 describes a production method for a heat conductive insulation sheet in which a mixture of an addition polymerization type liquid silicone rubber and a filler for enhancing its thermal conductivity is sheet-coated on a reinforcing fabric or non-woven fabric, and then cross-linked. Here, the fabric or non-woven fabric may comprise one of inorganic fibers such as glass fiber, silica fiber, alumina fiber, or boron nitride fiber, or organic fibers such as those of polyester or fluororesin.

(5) Japanese Patent Application Laying-open No. 219034/1983 describes a production method for an electrical insulating heat dissipation rubber sheet in which a fluid silicone rubber composition containing alumina powder is coated on a reticulated insulation material and then cured. Here, the reticulated insulation material includes fabrics, knits, non-woven fabrics, and laminates thereof, and specific examples of which includes, for example, glass fiber, asbestos fiber, and silicon carbide fiber which have heat resistance matching for that of the silicone resin.

In any of (4) and (5) above, use is made of a silicone resin of good fluidity and low viscosity in order to promote integration with the reinforcing material. As described above, it is known in the art, in the production of a silicone resin sheet with a high thermal conductivity, to make an improvement in tear strength of the sheet by reinforcing it with a fabric of fiber or non-woven fabric.

However, these production methods have been expected to be useful in the application of heat dissipation of heat generating electronic parts such as power transistors, thyristors, and the like and therefore cannot always be applied to electrical insulation materials for electrical apparatuses such as rotary machines and transformers. In the case of electrical insulation materials for rotary machines and transformers, the electrical insulation characteristic as well as the following characteristics are particularly important.

(A) Long-term Reliability

In the area of large-sized rotary machines and transformers, it is often the case that the heat resistant temperature is required to be as high as 155 to 180° C. In particular, with the recent trend toward down-sized and highly integrated machines, the type of usable materials is naturally limited to those that can ensure long-term reliability under more severe environment. Consequently, the reinforcing material preferably has a heat resistance same as or higher than that of silicone resin.

(B) Heat Shock Resistance

Electrical insulation materials are often used in parts which are exposed to repeated heating and cooling. Therefore, to prevent the occurrence of peeling or microfracture due to a thermal shock, it is important to select a material having the same thermal characteristic as the linear expansion coefficient (2 to $5 \times 10^{-5}$/° C.) of silicone resin.

(C) Low Dielectric Constant

When the insulation material is used as a main insulation material, application of an alternating electrical field thereto generates heat inside it due to dielectric loss. The amount of heat generated is proportional to the product of the dielectric constant and the dielectric loss of the insulation material. Therefore, a material is preferable which is small in these values.

(D) Flexibility

When used in an insulating tape for conductors of rotary machines or transformers, the tape is required to have an appropriate elongation so that the tape is well compatible with the conductors to achieve a crease-free winding condition.

(E) Lightweight

Lightweight of insulation material is one of unnegligible items which are important when down-sizing of machines is attempted.

(F) Voidless

Presence of a void, i.e., an independent bubble, is undesirable since it leads to generation of corona discharge and is a cause for disturbing heat conduction.

In view of the above, it can be pointed out that the heat conductive silicone resin sheets reinforced with a fabric or non-woven fabric which are produced by conventionally proposed production methods have the following problems.

That is, in view of long-term reliability, the above-described inorganic fibers and highly heat resistant organic fibers are preferable. However, the inorganic fibers have problems in that: (a) linear expansion coefficient is small (e.g. E glass fiber: $5 \times 10^{-6}/°$ C.), (b) dielectric constant is high (e.g. E glass 6.7–(1 MHz)), and (c) a silicone resin sheet reinforced with a fabric or non-woven fabric of inorganic fiber is low in flexibility, because the tensile elongation is small (normally less than 2%). Further, since in general inorganic fibers are greater in specific gravity than organic compounds, they are disadvantageous for constructing lightweight machines.

On the other hand, among organic fibers, those having heat resistance same as or higher than that of silicone resin are limited to aramide fibers, polyether ketone fibers, polytetrafluoroethylene fibers, and the like. However, when using a fabric comprising organic fibers as a reinforcing material, there are problems in practical applications such as (d) high anisotropy between vertical and horizontal directions, (e) since it is a bound structure, there is a danger of generation of a difference in movement between silicone resin and fiber, resulting in gradual failure in close contact (adhesion), (f) slitting into a tape form is not easy, and (g) in general, fabrics are expensive.

Further, in the sheet molded material using the above-described heat resistant non-woven fabric and the addition polymerization type liquid silicone rubber, there is a fear of degraded productivity. Still further, in the production methods of above references (4) and (5), elimination of voids is not considered which is particularly required for transformers.

DISCLOSURE OF THE INVENTION

As described above, there have heretofore been available no materials of heat resistant flexible sheets having both electrical insulation property and thermal conductivity satisfactory enough to be usable in transformer and rotary machine applications.

Therefore, an object of the present invention is to provide a composite sheet which has both satisfactory electrical insulation property and thermal conductivity and is excellent in heat resistance and flexibility, and a production method therefor.

A further object of the present invention is to provide an electrical apparatus comprising such a composite sheet and having improved heat dissipation characteristic.

Under the above circumstances, the inventors have conducted intensive studies for solving the above problems and found that a composite sheet has good properties and can solve the above problems when it comprises a resin having rubber elasticity as a matrix, reinforced with a molded material comprising a fibrous organic compound and with an inorganic filler, wherein an internal porosity is 10% or less and a specific gravity is 1 to 2, thus accomplishing the present invention.

Specifically, 1) the composite sheet according to a first aspect of the present invention is a sheet including a molded material comprising a fibrous organic compound, an inorganic filler, and a matrix resin comprising a resin having rubber elasticity reinforced with the molded material and the inorganic filler, wherein said composite sheet has an internal porosity is 10% or less, a specific gravity is 1 to 2, and a thermal conductivity in a thickness direction is at least 0.4 W/mK.

2) In the composite sheet described in 1) above, the molded material comprising the fibrous organic compound may be an aramide paper comprising an aramide fibrid and an aramide fiber, and the organic filler may have a thermal conductivity at 20° C. of at least 1 W/mK.

3) In the composite sheet described in 2) above, the aramide paper may have a basis weight of 10 $g/m^2$ to 200 $g/m^2$, and the composite sheet may contain at least 5% by weight of the aramide paper.

4) In the composite sheet described in 2) or 3) above, aramide constituting the aramide paper is preferably poly (m-phenylene isophthalamide).

5) In the composite sheet described in any one of 1) to 4) above, the inorganic filler preferably may have a thermal conductivity at 20° C. of at least 5 W/mK.

6) In the composite sheet described in any one of 1) to 5) above, the inorganic filler is preferably at least one selected from the group consisting of aluminum oxide, boron nitride, silicon nitride, magnesium oxide, and beryllium oxide.

7) In the composite sheet described in any one of 1) to 6) above, the matrix resin is preferably silicone rubber.

8) A production method of composite sheet according to a second aspect of the present invention is a production method of a composite sheet described in any one of 1) to 7), wherein an inorganic filler is made to coexist with one of a molded material comprising an aramide fibrid and an aramide fiber and a matrix resin having rubber elasticity, and wherein the molded material and the matrix resin are contacted to composite.

9) A production method of composite sheet according to a third aspect of the present invention is a production method of a composite sheet described in any one of 1) to 7) above, wherein a molded material comprising an aramide fibrid and an aramide fiber is impregnated or coated with a resin containing an inorganic filler and having rubber elasticity to form a composite sheet.

10) An electrical apparatus improved in heat dissipation characteristic according to a fourth aspect of the present invention comprises a composite sheet described in any one of 1) to 7) above.

BEST MODE FOR CARRYING OUT THE INVENTION

The present invention will be described in detail below.

In the present invention, the molded material comprising a fibrous organic compound is preferably an aramide paper comprising an aramide fibrid and an aramide fiber. Here, aramide means a linear polymer compound of which 60% or more of amide bond is bonded directly to an aromatic ring. As such an aramide, there are exemplified poly(m-phenylene isophthalamide) and copolymers thereof, poly(p-phenylene terephthalamide) and copolymers thereof, poly(p-phenylene)-copoly(3,4-diphenylether)terephthalamide, and the like. Of these, poly(m-phenylene isophthalamide) is preferably used for its good moldability and heat sealability. Poly(m-phenylene isophthalamide) can be industrially produced by an interfacial polymerization method, a solution polymerization method, or the like known in the art using isophthaloyl chloride and m-phenylene diamine.

Aramide fibrid means film-formed aramide particles having a paper forming property, and is also referred to as aramide pulp (see Japanese Patent Application Publication No. 11851/1960, Japanese Patent Application Publication No. 5752/1962, and the like). The aramide fibrid, as ordinary wood pulp, can be used as a paper forming material after maceration and beating. In this case, it is preferable to adjust the freeness of the aramide fibrid to maintain a good characteristic of the aramide paper; normally the freeness is selected from the range of 50 ml to 500 ml in Canadian Standard Freeness.

Aramide fiber is a fiber based on aramide. As such a fiber can be exemplified "KONEX" (registered trademark) and "TECHNOLA" (registered trademark) from Teijin, "API-AIRE" (registered trademark) from Unitika, "NOMEX" (registered trademark) and "KEVLAR" (registered trademark) from DuPont, "TOWALON" (registered trademark) from Akzo, and the like. However, the aramide fiber is not limited to these products.

In the present invention, the fineness of fiber is selected preferably from the range of from 0.5 to 20 denier and the length of the fiber is selected from the range of from 1 to 50 mm. If the length is smaller than 1 mm, the mechanical characteristics of the composite will be degraded.

On the other hand, a length of longer than 50 mm is not preferable because "entanglement" or "bundling" tends to occur during the production of non-woven fabrics by a wet process, which causes a defect. Similarly, a fiber of less than 0.5 denier is not preferable because agglomeration tends to occur in the production by a wet process. Further, a fiber of more than 20 deniers has disadvantages such as reduction in aspect ratio, degradation of mechanical reinforcing effect, unevenness of non-woven fabrics, and the like because the fiber diameter is too large (for example, 45 microns or more in diameter for circular cross section).

In the present invention, the aramide paper means a sheet-formed molded material produced from the aramide fibrid and/or aramide fiber by a dry or wet method.

The ratio of aramide fibrid/aramide fiber of the aramide paper is freely selected from the range of 5/95 to 100/0 (weight %).

In the present invention, a different heat-resistant fiber may be added to the aramide paper comprising aramide fibrid and/or aramide fiber as far as the paper characteristic is not degraded. Such a heat-resistant fiber includes organic fibers such as polyphenylene sulfide fiber, polyether-ether-ketone fiber, polyester fiber, arylate fiber, liquid crystal polyester fiber, and polyethylene-naphthalate fiber; and inorganic fibers such as glass fiber, rock wool, asbestos, boron fiber, and alumina fiber. However, the heat-resistant fiber is not limited to these fibers.

The basis weight (weight per unit $m^2$: unit in $g/m^2$) of the aramide paper is preferably 10 to 200 $g/m^2$. Paper with a basis weight of less than 10 $g/m^2$ generally has insufficient uniformity in thickness and in basis weight so that it is difficult to obtain a composite sheet of stable characteristics therewith. On the other hand, paper with a basis weight of more than 200 $g/m^2$ has a problem in that it is difficult therewith to obtain a desired thermal conductivity after composite formation with a resin, which will be described later.

In the production of the aramide paper, a conventional method known in the art such as a spun lace method, a wet sheeting method, or the like can be applied. Further, the resulting sheet can also be hot-pressed to improve paper characteristics such as surface smoothness and mechanical characteristics.

In the present invention, the reasons why the aramide paper is preferably used include that: (1) it has advantageous characteristics such as heat resistance and fire resistance, (2) it is effective for overcoming the insufficient flexibility which is a defect of the conventional glass cloth-silicone rubber composites, (3) since it contains aramide fibrid having high drapeability, the dielectric breakdown characteristic of the composite sheet is not degraded, (4) since it is high in liquid retention, a conventional technique such as coating can be applied, and use of it is thus advantageous in the production of composite sheet, (5) aramide has a low specific gravity of about 1.4, which can contribute to the production of a lightweight composite sheet, and (6) since aramide material has the same thermal expansion coefficient as silicone resin, the danger of defect generation due to heat shock can be expected to be small.

In the present invention, the inorganic filler means granular, fibrous, plate-formed, or amorphous particles of an inorganic compound. The inorganic filler preferably has a thermal conductivity of at least 1 W/mK or (at 20° C.). Such an inorganic filler includes inorganic compounds such as calcium silicate, heavy calcium silicate, magnesium silicate, aluminum oxide, silicon carbide, silicon nitride, potassium titanate, magnesium oxide, boron nitride, titanium oxide, silicon oxide, aluminum nitride, aluminum borate, boron oxide, beryllium oxide, calcium carbonate, glass, mica, and talc. However, the inorganic filler is not limited to these compounds. Among these, such inorganic compounds as aluminum oxide, boron nitride, silicon nitride, magnesium oxide, and beryllium are selected with preference, which are relatively high in thermal conductivity. Further, it is at least more preferable when the thermal conductivity is 5 W/mK. Still further, when these inorganic compounds are crystalline substances, their thermal conductivity is anisotropic. Hence, in the present invention, the thermal conductivity of an inorganic compound is defined as the thermal conductivity of a molded bulk which is powder sintered. Criteria for the selection of an inorganic compound are whether or not the dielectric breakdown voltage is 10 kv/mm or more and whether or not the volume resistivity is $10^{13}$ ohm·cm or more for a molded material obtained by powder sintering. Therefore, from the concept of the present invention, a metal element itself, which is a good thermal conductor, cannot be used even if it has high enough a thermal conductivity.

Inorganic fillers of various sizes may be used and it is thus difficult to uniquely specify the size of the inorganic filler to be used. However, in the case where it is in a granular form, one which is 0.1 micron to 1 mm in diameter is normally used, and in the case where it is in a fibrous form, one which is 10 microns to 10 mm in length is normally used.

In the present invention, the matrix resin having rubber elasticity is a resin having at least one cross-linked point per polymer chain which constitutes the resin. Here, the cross-linked point means a site where a polymer chain is chemically or physically bonded to another polymer chain. The cross-linked point corresponds to a chemical bond in the former case and to a crystal region or an aggregated part in the latter case. To provide rubber elasticity, it is essential that a polymer chain between any adjacent cross-linked points be in a temperature environment which is above the glass transition point of the polymer chain concerned. Therefore, in general, a resin exhibiting rubber elasticity at room temperature is one in which the polymer chain between any adjacent cross-linked points has a glass transition point of below room temperature.

In the present invention, rubber elasticity means that after a large deformation, the deformation is almost perfectly recovered by stress removal, whereas rheologically, it means a property in which the viscoelastic behavior played in an intermediate temperature region between glass state and fluid state temperatures is observed at room temperature or below.

Examples of such resins having rubber elasticity include polymer compounds such as styrene-butadiene rubber, high-styrene rubber, isoprene rubber, nitrile-butadiene rubber, chloroprene rubber, butyl rubber, silicone rubber, room temperature vulcanized silicone rubber, hydrogenated nitrile rubber, polyether based special rubber, fluorinated rubber, tetrafluoroethylene-propylene rubber, acrylic rubber, chlorosulfonated polyethylene rubber, epichlorohydrin rubber, propylene oxide rubber, ethylene-acrylic rubber, norbornene rubber, styrene based thermoplastic elastomer, olefin based thermoplastic elastomer, urethane based thermoplastic elastomer, polyester based thermoplastic elastomer, polyamide based thermoplastic elastomer, polybutadiene based thermoplastic elastomer, polyvinyl chloride based thermoplastic elastomer, and fluorinated thermoplastic elastomer. Of these, silicone rubber based ones and fluorinated rubber based ones are preferable for their excellent heat resistance, chemical resistance, and flame retarding properties; particularly, the silicone rubber is preferable.

As the silicone rubber, there can be used those obtained by cross-linking polydimethylsiloxanes with a cross-linking agent, or those obtained by cross-linking addition polymerization type liquid silicone with a platinum catalyst.

In the present invention, as far as the improvement of the thermal conductivity of the composite sheet is concerned, it is not always necessary to use only a resin having rubber elasticity. However, when importance is attached to no substantial degradation of good proccessability, flexibility, and handling characteristics of conventional electrical insulating aramide paper, rubber elastic resins are preferably selected.

The composite sheet preferably has an internal porosity of 10% or less. Here, the internal porosity is defined as independent bubbles (voids) produced due to insufficient permeation of the matrix resin.

Presence of internal porosity is not preferable because it is feared that it generates corona discharge when a high voltage is applied, and it disturbs heat conduction or for some other reasons. When the weight ratio of the molded material comprising a fibrous organic compound in the composite sheet is small, the internal porosity is given by the following equation:

$$\text{Internal porosity } (\%) = (1-(\text{specific gravity of composite sheet})/(\text{specific gravity of filler+matrix resin mixture})) \times 100.$$

According to studies by the inventors, an inclination has been observed that thermal conductivity is exponentially decreased with increasing internal porosity.

The specific gravity of the composite sheet according to the present invention is preferably 1 to 2. A specific gravity of less than 1 suggests the presence of large amounts of voids in the inside. On the other hand, with a specific gravity of exceeding 2, there arise problems of inferior lightweightness and increased dielectric constant.

Next, the construction of the composite sheet according to the present invention will be described. The composite sheet of the present invention comprises the above-described aramide paper, an inorganic filler, and a matrix resin having rubber elasticity. These three materials may be composited by various methods. Examples of the methods are exemplified below:

(a) The resin previously mixed with the inorganic filler is impregnated into or coated on the aramide paper.

(b) The inorganic filler is added during the production of aramide paper and then the resin is impregnated or coated.

(c) The aramide paper is sprayed or impregnated with a dispersion of the inorganic filler, and then impregnated or coated with the resin.

By any of the above-described methods, the molded material comprising a fibrous organic compound, the inorganic filler, and the resin having rubber elasticity (matrix resin) can be closely contacted to each other to form a structure with low internal porosity.

Of these methods, the method (a) is considered to be most practical and, hence, an example thereof will be described in detail below.

Although no particular limitation is posed on the method of mixing the inorganic filler with the matrix resin, it can be broadly divided into the following two methods according to the properties of the resin used. Specifically, when the resin is a liquid with low viscosity, the method is convenient in which after adding the inorganic filler, the mixture is agitated and mixed in a vessel equipped with an impeller. On the other hand, in the case of high viscosity or solid resin, it is recommended to use a method in which the resin is increased in plasticity by heating it or diluting it with a solvent, the inorganic filler is added, and then mixed in an apparatus such as an extruder or a kneader. Needless to say, the mixing method is not limited to these methods.

The amount of the inorganic filler added to the resin in the above methods is selected from the ranges of from 5 to 200 parts by weight, more preferably from 10 to 150 parts by weight, based on 100 parts by weight of the resin. The upper limit of the range is specified from the viscosity and fluidity of the filler mixture, whereas the lower limit is determined from the thermal conductivity characteristic of the composite sheet.

The amount of the resin having rubber elasticity to be composited with the aramide paper is varied depending on the porosity of the aramide paper and the degree of permeation of the resin into the paper; in perfect permeation, at least 0.25 times the paper weight is required. When permeation is imperfect, it is preferred that the amount of the resin fall in the above-described ranges of internal porosity and specific gravity.

As a method for impregnating the resin into the aramide paper, there can be used any appropriate methods, such as the method in which the resin improved in plasticity by heating or solvent dilution is discharged on the aramide paper, and the method in which the aramide paper is dipped in a resin liquid or plasticized resin. In any case, rolling or pressing may be used to promote the impregnation. When the resin is thermosetting, the resin impregnated aramide paper can be heated and/or hot pressed under appropriate conditions.

To coat the resin on the aramide paper, there can be used a machine which operates in a known coating manner. Examples of such a coating machine include an air doctor coater, a blade coater, a rod coater, a knife coater, a squeeze coater, a reverse roll coater, a transfer roll coater, a gravure coater, a kiss-roll coater, a cast coater, a spraying coater, and a curtain coater. However, the coating machine is not limited to these machines.

In compositing the aramide paper and the resin, the aramide paper can also be surface treated in order to enhance adhesion of paper to the resin. This treatment includes plasma treatment, corona discharge treatment, and primer treatment. However, the treatment is not limited to these methods.

In the compositing, the thickness of the sheet is controlled to be in the ranges of from 0.01 mm to 10 mm.

The lower limit of the thickness comes from the limitation of basis weight of the aramide paper. On the other hand, when the thickness of the composite sheet is 10 mm or more, relative contribution of paper is substantially decreased, resulting in degraded mechanical characteristics.

In the present invention, aramide papers of different structures can be stacked or laminated, followed by impregnation with resin to form a composite. As an example, with the aim of improving the rigidity of the sheet, a multilayered composite sheet comprising a p-aramide containing paper and another aramide paper, laminated one on another, is also included in the scope of the present invention. Further, with the aim of improving the elasticity characteristics and mechanical characteristics of the resin, there can be used a blend of a plurality of resins. Still further, a plurality of types of resins may be successively impregnated.

In the present invention, the thermal conductivity in the thickness direction of the composite sheet is preferably 0.4 W/mK (at 20° C.). Since the thermal conductivity of the aramide paper used as the base material is not more than about 0.2 W/mK, it is preferable that the thermal conductivity of the composite sheet be more than the above value. More preferably, it is at least 0.5 W/mK.

EXAMPLES

The present invention will be described by way of examples. However, these examples are not limiting the contents of the present invention. Further, unless otherwise indicated, all parts are by weight.

(Measurement method)

(1) Measurement of basis weight and thickness of sheet Measured according to JIS C2111.

(2) Tear strength Measured according to JIS P8116.

(3) Thermal conductivity Measured using Quick Thermal Conductivity Meter QTM-D2 manufactured by Kyoto Denshi Kogyo Co., Ltd. The sheet was allowed to stand in a chamber at a temperature of 2° C. and at a humidity of 55% for 24 hours before measurement.

(4) Insulation breakdown voltage Measured according to JIS C2111.

(5) Dielectric constant Measured according to JIS C2318.

(6) Air permeability

Using a Garley type air permeability meter, a time for passing 100 cc of air (air permeability) was measured. For a series of sheet, the shorter the time, the more the porosity.

Reference Example (1) Preparation of raw materials

By a method using a wet type precipitator comprising a stator and a rotor described in Japanese Patent Publication No. 151624/1977, a fibrid of poly(m-phenylene isophthalamide) was produced. The fibrid was treated by a macerator and a beater to adjust Canadian Standard Freeness (CSF) to 105 ml. On the other hand, m-aramide fiber (TEIJIN KONEX (registered trademark) manufactured by Teijin was cut to a length of 6 mm for use as a sheeting material. This fiber had a thickness of 2 deniers.

(2) Production of aramide paper

The resulting aramide fibrid and fiber were respectively dispersed in water to obtain slurries. After mixing for a ratio of aramide fibrid/aramide fiber=20/80, the slurries were fed to a Fourdrinier paper machine, slushed, squeezed, dried, and wound to obtain aramide paper. Main properties of the paper are shown in Table 1.

TABLE 1

| Fiber/Fibrid | wt % | 20/80 |
| --- | --- | --- |
| Basis weight | g/m$^2$ | 75 |
| Thickness | mm | 0.236 |
| Bulk density | g/cm$^3$ | 0.32 |
| Air permeability | sec/100 cc | 150 |

Example 1

The aramide paper produced in the above reference example was impregnated under the atmospheric pressure with a solution obtained by diluting 100 parts of addition polymerization type liquid silicone resin (Dow Corning SILASCON (registered trademark) RTV DKQ4-317 high thermal conductivity ceramic contained, thermal conductivity: 0.80 W/mK, specific gravity: 1.75) with 80 parts of toluene. Further, the aramide paper was again impregnated with a solution of 100 parts of silicone resin diluted with 50 parts of toluene. Then, after undiluted resin was coated on one side, the sheet was hot pressed at 120° C. for 5 minutes. The resulting sheet was soft and highly flexible.

Example 2

A sheet was produced using the same procedures as in Example (1) except that the impregnation with the resin diluted with 50 parts of toluene was omitted. The resulting sheet was soft and highly flexible.

The properties of the composite sheets produced in Examples 1 and 2 are summarized in Table 2.

TABLE 2

|  | Unit | Example 1 | Example 2 |
| --- | --- | --- | --- |
| Basis weight of aramide paper | g/m$^2$ | 75 | 75 |
| Thickness of aramide paper | mm | 0.236 | 0.236 |
| Density of aramide paper | mm | 0.32 | 0.32 |
| Air permeability of aramide paper | sec/100 cc | 150 | 150 |
| Volume resistivity | ohm·cm | >10$^{13}$ | >10$^{13}$ |

TABLE 2-continued

| | Unit | Example 1 | Example 2 |
|---|---|---|---|
| of filler | | | |
| Thermal conductivity of filler | W/mK | >21 | >21 |
| Basis weight of composite sheet | g/m² | 788 | 823 |
| Thickness of composite sheet | mm | 0.45 | 0.48 |
| Density of composite sheet | g/cm³ | 1.75 | 1.71 |
| Tear strength of composite sheet | kg | 0.81 | 0.78 |
| Breakdown voltage of composite sheet | kv/mm | 15 | 14 |
| Internal porosity of composite sheet | % | 0 | 2.3 |
| Thermal conductivity of composite sheet | W/mK | 0.74 | 0.70 |

Comparative Examples 1, 2 and 3

Sheets were produced using the same aramide paper as in Example 1 except that different impregnation steps were used. The impregnation contents are shown in Table 3 and Table 4, along with the properties of the impregnated sheets shown in Table 4.

TABLE 3

| Comparative Example | First impregnation | Second impregnation | One-side coating | Hot pressing |
|---|---|---|---|---|
| 1 | Treated | Treated | Untreated | Untreated |
| 2 | Treated | Untreated | Untreated | Treated |
| 3 | Treated | Treated | Untreated | Treated |

TABLE 4

| Comparative Example | Basis weight g/m² | Density g/cm³ | Porosity % | Thermal conductivity W/mK |
|---|---|---|---|---|
| 1 | 323 | 0.83 | 53 | 0.09 |
| 2 | 295 | 1.40 | 20 | 0.30 |
| 3 | 318 | 1.51 | 14 | 0.39 |

It has been found that when the internal porosity exceeds 10%, thermal conductivity becomes smaller than 0.40 W/mK.

Industrial Applicability

According to the present invention, a heat-resistant aramide composite sheet can be provided which has high thermal conductivity and electrical insulation property with improved flexibility. Such a composite sheet can be widely utilized as an insulation material for electrical apparatus such as rotary machines and transformers. In particular, the sheet can be advantageously used as electrical insulation materials for compact and highly integrated type apparatus requiring efficient heat dissipation.

As a result of improvement in heat dissipation characteristics of electrical apparatus and realization of down-sized machines, the present invention can be expected to provide such effects as cost reduction by reduction of parts to be used and substitution with inexpensive materials, space-saving, lightweight construction of machines and energy saving.

What is claimed is:

1. A composite sheet including a molded material comprising a fibrous organic compound, an inorganic filler, and a matrix resin comprising a resin having rubber elasticity, said matrix resin reinforced with said molded material and said inorganic filler, wherein said composite sheet has an internal porosity of 10% or less, a specific gravity of 1 to 2, and a thermal conductivity in a thickness direction of at least 0.4 W/mK.

2. The composite sheet as claimed in claim 1, wherein said molded material comprising said fibrous organic compound is an aramide paper comprising an aramide fibrid and an aramide fiber, and said inorganic filler has a thermal conductivity at 20° C. of at least 1 W/mK.

3. The composite sheet as claimed in claim 2, wherein said aramide paper has a basis weight of 10 g/m² to 200 g/m², and said composite sheet contains at least 5% by weight of said aramide paper.

4. The composite sheet as claimed in claim 2 wherein aramide constituting said aramide paper is poly(m-phenylene isophthalamide).

5. The composite sheet as claimed in claim 1, wherein said inorganic filler has a thermal conductivity at 20° C. of at least 5 W/mK.

6. The composite sheet as claimed in claim 1, wherein said inorganic filler is at least one selected from the group consisting of aluminum oxide, boron nitride, silicon nitride, magnesium oxide, and beryllium oxide.

7. The composite sheet as claimed in claim 1, wherein said matrix resin is silicone rubber.

8. A method for producing a composite sheet described in claim 1, wherein an inorganic filler is made to coexist with one of a molded material comprising an aramide fibrid and an aramide fiber and a matrix resin having rubber elasticity, and wherein said molded material and said matrix resin are contacted to form a composite sheet.

9. A method for producing a composite sheet described in claim 1, wherein a molded material comprising an aramide fibrid and an aramide fiber is impregnated or coated with a resin containing an inorganic filler and having rubber to for a composite sheet.

10. An electrical apparatus having improved heat dissipation characteristic, comprising a composite sheet as described in claim 1.

11. The composite sheet as claimed in claim 3, wherein aramide constituting said aramide paper is poly(m-phenylene isophthalamide).

12. The composite sheet as claimed in claim 2, wherein said inorganic filler has a thermal conductivity at 20° of at least 5 W/mK.

13. The composite sheet as claimed in claim 3, wherein said inorganic filler has a thermal conductivity at 20° of at least 5 W/mK.

14. The composite sheet as claimed in claim 4, wherein said inorganic filler has a thermal conductivity at 20° of at least 5 W/mK.

15. The composite sheet as claimed in claim 2, wherein said inorganic filler is at least one selected from the group consisting of aluminum oxide, boron nitride, silicon nitride, magnesium oxide, and beryllium oxide.

16. The composite sheet as claimed in claim 3, wherein said inorganic filler is at least one selected from the group consisting of aluminum oxide, boron nitride, silicon nitride, magnesium oxide, and beryllium oxide.

17. The composite sheet as claimed in claim 4, wherein said inorganic filler is at least one selected from the group consisting of aluminum oxide, boron nitride, silicon nitride, magnesium oxide, and beryllium oxide.

18. The composite sheet as claimed in claim 2, wherein said matrix resin is silicone rubber.

19. The composite sheet as claimed in claim 2, wherein said inorganic filler is at least one selected from the group consisting of aluminum oxide, boron nitride, silicon nitride, magnesium oxide, and beryllium oxide.

20. The composite sheet as claimed in claim 2, wherein said matrix resin is silicone rubber.

* * * * *